United States Patent [19]
Kanai et al.

[11] Patent Number: 5,178,905
[45] Date of Patent: Jan. 12, 1993

[54] PROCESS FOR THE FORMATION OF A FUNCTIONAL DEPOSITED FILM BY HYDROGEN RADICAL-ASSISTED CVD METHOD UTILIZING HYDROGEN GAS PLASMA IN SHEET-LIKE STATE

[75] Inventors: Masahiro Kanai, Tokyo; Atsushi Yamagami, Kawasaki, both of Japan

[73] Assignee: Canon Kabushiki Kaisha, Tokyo, Japan

[21] Appl. No.: 882,238

[22] Filed: May 8, 1992

Related U.S. Application Data

[63] Continuation of Ser. No. 744,820, Aug. 12, 1991, abandoned, which is a continuation of Ser. No. 439,539, Nov. 21, 1989, abandoned.

[30] Foreign Application Priority Data

Nov. 24, 1988 [JP] Japan .................. 63-294739

[51] Int. Cl.$^5$ .............................................. B05D 3/06
[52] U.S. Cl. .................................. 427/570; 427/255.2
[58] Field of Search .......................... 427/39, 255.2

[56] References Cited

U.S. PATENT DOCUMENTS

| | | | |
|---|---|---|---|
| 4,717,586 | 1/1988 | Ishihara et al. | 427/39 |
| 4,772,570 | 9/1988 | Kanai et al. | 427/39 |
| 4,818,564 | 4/1989 | Ishihara et al. | 427/69 |
| 4,842,945 | 6/1989 | Ito et al. | 427/39 |
| 4,898,118 | 2/1990 | Murakami et al. | 427/39 |
| 4,900,694 | 2/1990 | Nakagama | 427/39 |

FOREIGN PATENT DOCUMENTS

| | | |
|---|---|---|
| 59-88820 | 5/1984 | Japan . |
| 60-41047 | 3/1985 | Japan . |
| 61-119676 | 6/1986 | Japan . |
| 63-28883 | 2/1988 | Japan . |

Primary Examiner—Shrive Beck
Assistant Examiner—Benjamin L. Utech
Attorney, Agent, or Firm—Fitzpatrick, Cella, Harper & Scinto

[57] ABSTRACT

A process for forming a functional deposited film which comprises: introducing a precursor composed mainly of Group IV elements to be constituents for a deposited film to be formed into a substantially enclosed film-forming space being kept at 0.1 to 50 mTorr into which hydrogen gas plasma is drawn in a sheet-like state and a substrate is positioned parallel to said sheet-like hydrogen gas plasma, and exhausting the gases in the film-forming space in the direction perpendicular to the sheet-like hydrogen gas plasma and the substrate, said precursor being generated in an precursor generation space situated separately from said film-forming space, said sheet-like hydrogen gas plasma being formed such that a distance (L) of 5 to 50 mm is established between the boundary thereof and the surface of the substrate, said precursor being introduced through gas feed means positioned substantially in said distance (L).

6 Claims, 4 Drawing Sheets

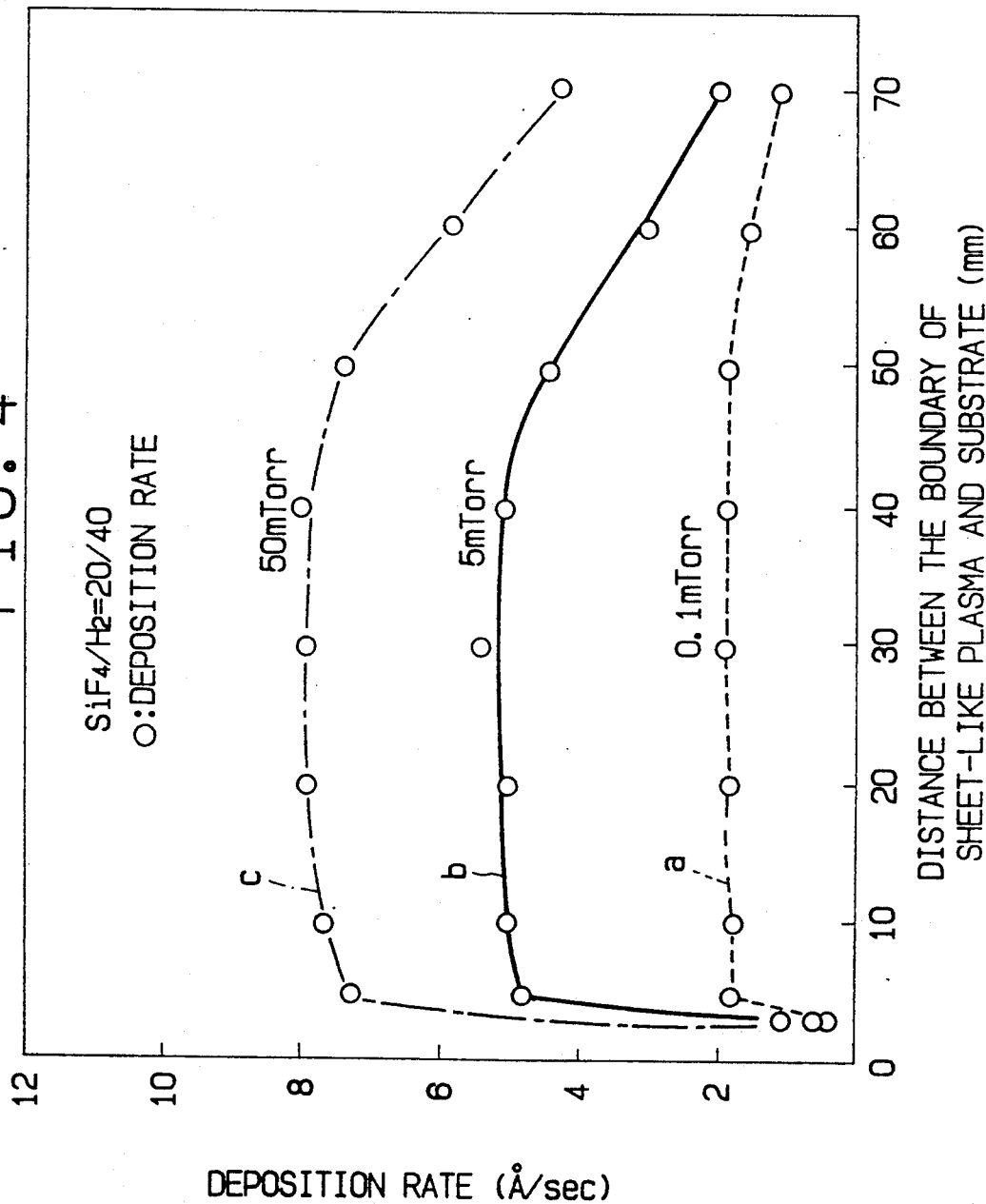

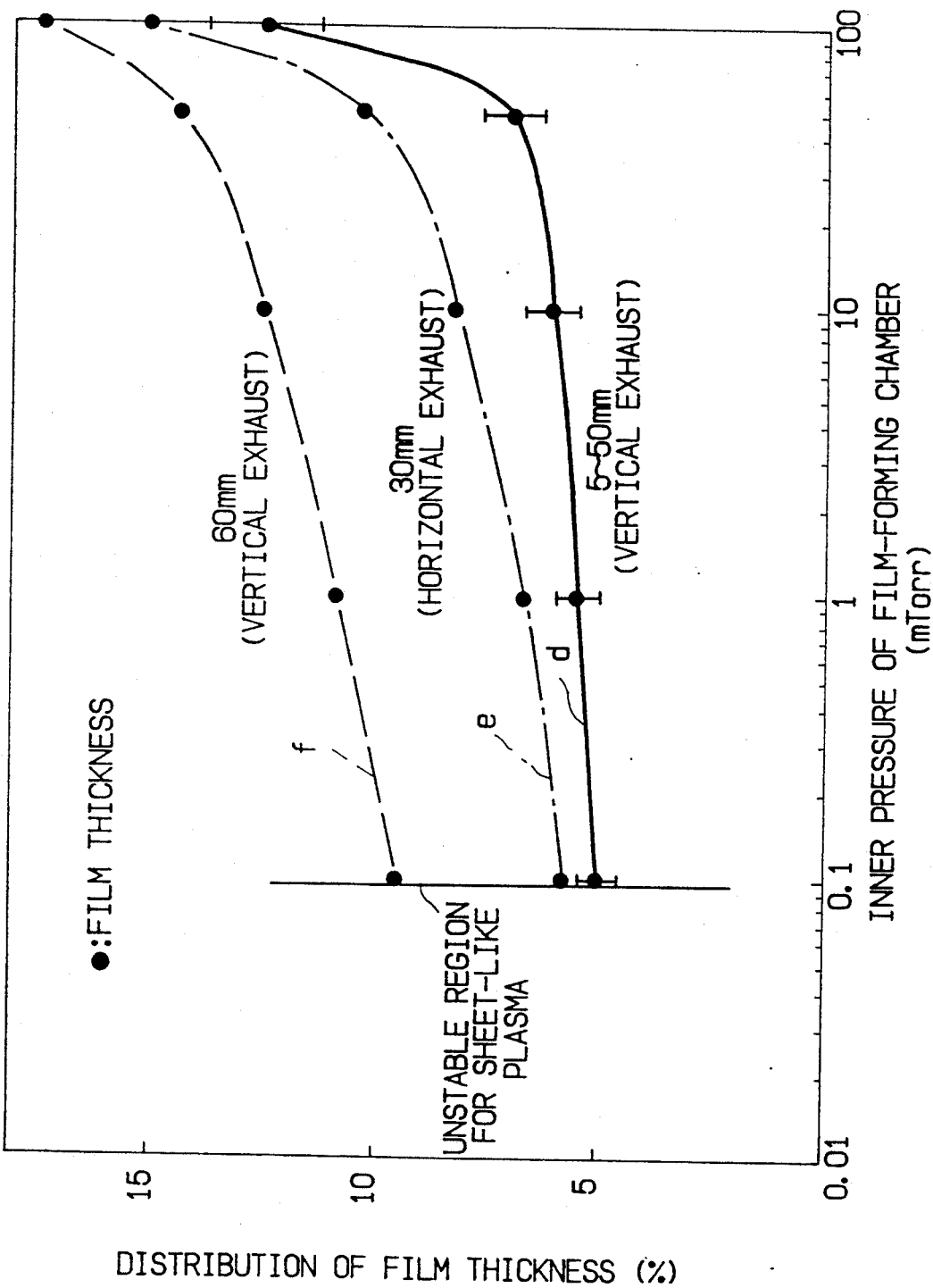

PROCESS FOR THE FORMATION OF A FUNCTIONAL DEPOSITED FILM BY HYDROGEN RADICAL-ASSISTED CVD METHOD UTILIZING HYDROGEN GAS PLASMA IN SHEET-LIKE STATE

This application is a continuation of application Ser. No. 07/744,820, filed Aug. 12, 1991, now abandoned which, in turn, is a continuation of application Ser. No. 07/439,539, filed Nov. 21, 1989, now abandoned.

FIELD OF THE INVENTION

The present invention relates to a hydrogen radical-assisted CVD process (hereinafter referred to as "HR-CVD process") for the formation of a functional amorphous or crystalline deposited film containing atoms of one or more elements belonging to Group IV of the Periodic Table as a matrix, which is usable especially as a photoconductive member for semiconductor devices, photosensitive devices for use in electrophotography, image input line sensors, image pickup devices, photoelectromotive force devices or the like.

More particularly, the present invention relates to an HR-CVD process for the formation of said deposited film wherein hydrogen gas plasma in a sheet-like state is utilized.

BACKGROUND OF THE INVENTION

Many processes have been developed for the formation of amorphous silicon deposited films. They include vacuum deposition process, plasma CVD process, CVD process, reactive sputtering process, ion plating process, and optical CVD process. The most popular among them is the plasma CVD process which has been currently put to practical use.

A disadvantage of forming a deposited film by the aid of plasma is that the substrate surface is damaged by plasma during deposition and this damage adversely affects the deposited film. Therefore, it is important to minimize the damage by plasma particularly in the case where the deposited film is intended to be of high-quality in order to prepare high-performance devices.

To this end, much has been studied and many improvements have been proposed. For example, Japanese Patent Laid-open No. 41047/1985 discloses a process for forming a deposited film on a substrate, without forming plasma, by introducing into the film deposition space the precursors and active species formed in the decomposition space situated separately from the film deposition space. This process is an HR-CVD process. In this HR-CVD process, hydrogen radicals as the active species play an important role in the control of quality and uniformity of a deposited film to be formed, and hence the process needs a means to provide a large amount of hydrogen radicals uniformly to a large area. However, such a means is not mentioned in the above-cited literature.

There has been proposed a process for producing a deposited film by the aid of plasma in sheet-like state. This process is put to practice by the aid of an apparatus for producing a compound semiconductor thin film as disclosed in Japanese Patent Laid-open No. 88820/1984. This apparatus is made up of a means to form sheet plasma containing Group V elements and a means to inject the molecular beam of other elements into the substrate through the sheet plasma.

Japanese Patent Laid-open No. 119676/1986 discloses an apparatus for forming a film which is made up of an unit which serves to form sheet-like plasma of chemically reactive gas or vapor containing elements capable of being the constituents of a deposited film and another unit which serves to introduce a laser beam vertically to a substrate on which a film is to be deposited.

The above-mentioned processes and apparatuses have a disadvantage in common, because they are designed such that plasma is confined to the vicinity of the substrate but is not in contact with the substrate. The disadvantage is that the sheet plasma containing the film constituent elements causes the film constituent elements to deposit on the circumferential walls of the apparatus as well as on the substrate in the sheet plasma forming unit or film forming chamber. This leads to the waste of raw material gas and makes it difficult to form a stable sheet plasma. For these reasons, the prior art does not permit the constantly efficient production of a desired deposited film.

SUMMARY OF THE INVENTION

It is an object of the present invention to provide an improved HR-CVD film-forming process which is free of the shortcomings involved in the prior art and is capable of forming a desired functional deposited film efficiently with a minimum loss of raw material gas.

It is another object of the present invention to provide an improved HR-CVD film-forming process which is designed to form a desired functional deposited film of high quality efficiently and consistently, without causing the substrate surface to be exposed to plasma directly.

A further object of the present invention is to provide an HR-CVD film-forming process for the formation of a functional amorphous or crystalline deposited film containing atoms of one or more elements belonging to Group IV of the Periodic Table as a matrix, which is usable especially as a photoconductive member for semiconductor devices, photosensitive devices for use in electrophotography, image input line sensors, image pickup devices, photoelectromotive force devices or the like.

BRIEF DESCRIPTION OF THE DRAWINGS

FIG. 4 is a graph showing the relationship between the distance between the substrate surface and the boundary of sheet-like plasma and the rate at which the deposited film is formed. This relationship was found in the experiments carried out to complete the present invention.

FIG. 5 is a graph showing the relationship between the internal pressure of the film forming chamber and the distribution of the thickness of the deposited film. This relationship was found in the experiments carried out to complete the present invention.

DESCRIPTION OF THE INVENTION

Figure 1:
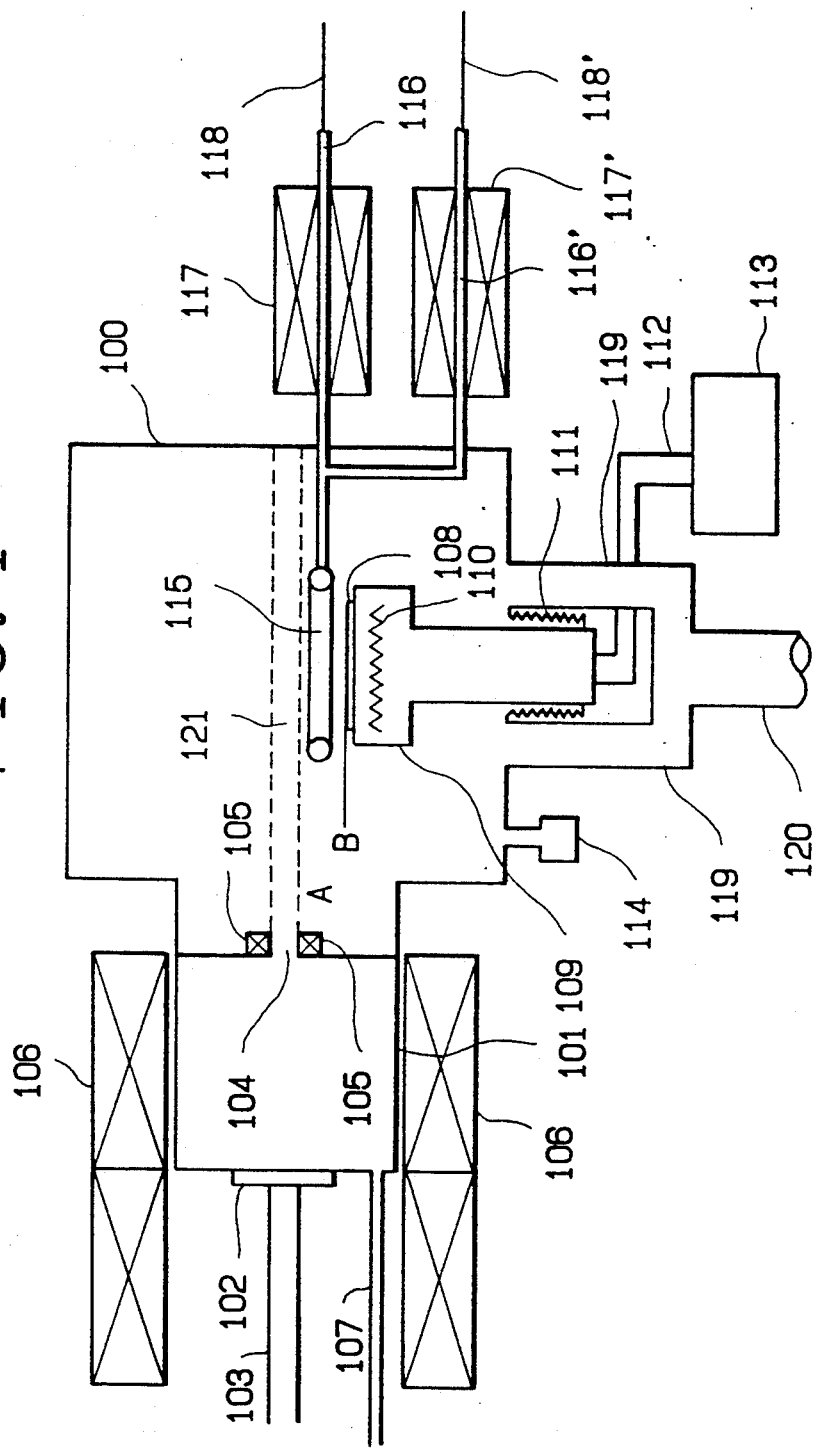
FIG. 1 a schematic drawing of a deposited film-forming apparatus suitable for practicing the process of the present invention for the formation of a deposited film.

In order to address the foregoing problems involved in the formation of a deposited film and to achieve the object of the present invention, the present inventors have carried out extensive studies and experiments (mentioned later). As a result, it has been found that the problems can be solved when a distance of 5 to 50 mm is established between the boundary of sheet-like hydrogen plasma and the substrate surface, an internal pressure of 0.1 to 50 mTorr is established in the film-forming space, and the raw material gas is discharged in the direction perpendicular to the hydrogen gas plasma and substrate.

The present invention has been accomplished on the basis of these findings.

The gist of the present invention resides in a process for forming a functional deposited film which comprises: introducing a precursor composed mainly of Group IV elements capable of contributing to the formation of a deposited film into a substantially enclosed film-forming space being kept at 0.1 to 50 mTorr into which hydrogen gas plasma is drawn in a sheet-like state wherein a substrate on which a deposited film is to be formed is positioned parallel to said sheet-like hydrogen gas plasma, and discharging the raw material gas from the film-forming space in the direction perpendicular to the sheet-like hydrogen gas plasma and the substrate, said precursor being generated in an activation space (decomposition space) situated separately from said film-forming space, said sheet-like hydrogen gas plasma being formed such that a distance (L) of 5 to 50 mm is established between the boundary thereof and the substrate surface, said precursor being introduced through gas feed means provided substantially in said distance (L).

Said hydrogen gas plasma is formed from hydrogen gas alone or hydrogen gas diluted with at least one kind of gas selected from the group consisting of helium, argon, neon, and xenon. Said precursor is formed from a halide or halogenated hydride of at least one kind of element selected from the group consisting of Si, Ge, and C.

According to the process of the present invention for forming a deposited film, hydrogen gas plasma in a sheet-like state is confined to the vicinity 5 to 50 mm away from the substrate surface on which a deposited film is to be formed. Hydrogen radicals diffusing toward the substrate from the hydrogen gas plasma react with the precursor formed from the foregoing halide or halogenated hydride. As a result, there is formed a deposited film whose constituent is Si, Ge, C, Si-Ge, or Si-C.

Incidentally, the "precursor" in the present invention denotes a material capable of contributing to the formation of a deposited film.

The sheet-like plasma or plasma drawn in a sheet-like state in the present invention denotes plasma having a thin plate-like shape, with the dimension perpendicular to the drawing direction being sufficiently large as compared with its thickness.

In the following, explanation is to be made with respect to a representative apparatus suitable for practicing the HR CVD process of the present invention and the experiments which have been carried out by the present inventors.

FIG. 1 is a schematic view illustrating the constitution of a typical film-forming apparatus suitable for practicing the HR-CVD process forming a deposited film of the present invention.

In the figure, numeral reference 100 stands for a substantially enclosed film-forming chamber equipped with a vacuum gauge 114 and which is connected to a plasma generation chamber 101 through a plasma jet nozzle 104.

The plasma generation chamber 101 is provided with a microwave introducing window 102 made of quartz, alumina, or the like which transmits microwave. To the microwave introducing window 102 is connected a waveguide 103 extending from a microwave power source (not shown) so that microwave is introduced into the plasma generation chamber 101 through the waveguide 103 and the microwave introducing window 102.

In the vicinity of the microwave introducing window 102, there is provided a gas supply pipe 107 extending from a reservoir for hydrogen gas ($H_2$) through which hydrogen gas is supplied into the plasma generation chamber 101.

Outside the plasma generation chamber 101, there is provided a plasma transfer magnet 106 which functions to draw the plasma generated in the plasma generation chamber 101 into the film-forming chamber 100 through the plasma jet nozzle 104. This plasma transfer magnet is installed such that its poles are positioned in the direction in which the plasma is drawn. It may be an electromagnet or permanent magnet.

Adjacent to the plasma jet nozzle 104 are a pair of magnets 105 (parallel with each other) to form sheet-like plasma. These magnets 105 are installed such that their poles are positioned at right angles to the direction in which the plasma is drawn. They may be an electromagnet or permanent magnet.

There are shown a sheet-like plasma 121 and a substrate 108 held parallel to said sheet-like plasma 121. There is also shown a precursor supply ring 115 between the sheet-like plasma 121 and the substrate 108. This precursor supply ring 115 is provided with a plurality of gas liberation holes (preferably, 4 to 16) through which the precursor is released.

Numeral references 116 and 116' stand for precursor generation chambers. Either of them is used, or both of them are used simultaneously, according to necessity. They are made of quartz, aluminum, or the like. With their outer surfaces, there are provided with activation energy supply means 117, 117' which generate activation energy of heat, light, or electricity. Numeral reference 118 stands for a gas feed pipe extending from a gas reservoir (not shown), which is connected to the precursor generation chamber 116. The gas feed pipe 118 serves to feed a precursor-generating raw material gas into the precursor generation chamber 116.

Likewise, numeral reference 118' stands for a gas feed pipe connected to the precursor generation chamber 116'.

In any case, a raw material gas is introduced through the gas feed pipe 118 or 118' into the precursor generation chamber 116 or 116' where the raw material gas as introduced is excited with the action of activation energy supplied by the activation energy supply means 117 or 117' to thereby generate a precursor. The precursor thus generated is successively introduced through the gas liberation holes of the precursor supply ring 115 into the film-forming chamber.

The substrate 108 is supported on a substrate holder 109 and is heated by an electric heater 110 installed in the substrate holder 109. The substrate holder 109 is vertically adjustable by a bellows 111 so that the distance between the sheet-like plasma 121 and the substrate 108 can be set as desired. The heater 110 is electrically connected to a temperature controller 113 through a pair of lead wires 112.

The film-forming chamber 100 is provided with a plurality of exhaust pipes 119. They should preferably be arranged parallel to the axis of the substrate holder 109 so that the raw material gas introduced into the film-forming chamber flows in the direction perpendicular to the sheet like plasma and the substrate. They are connected to the main exhaust pipe 120 being connected to an exhaust device (not shown).

The scope of the present invention is not limited to the above-mentioned apparatus. The apparatus may be connected to another apparatus for forming a deposited film through a gate valve or the like.

EXPERIMENT 1

A silicon deposited film was formed in the following manner using the apparatus for forming a deposited film as shown in FIG. 1.

First, a glass substrate 108 (Corning No. 7059) of 50 mm in diameter was placed on the substrate holder 109 in the film-forming chamber 100. The film-forming chamber 100 was evacuated through the exhaust pipe 119 until the inner pressure became about $1 \times 10^{-6}$ Torr. Then the substrate 108 was heated by the heater 110 and the temperature of the substrate surface was maintained at 250° C. $H_2$ gas was introduced at a flow rate of 40 sccm into the plasma generation chamber 101 through the gas supply pipe 107 and the inner pressure of the film-forming chamber 100 was maintained at about 0.1 mTorr. An electric current was applied to the plasma transfer magnet 106 (which is an electromagnet) so that a magnetic force (875 G) was generated in the vicinity of the microwave introducing window 102 made of a high-purity alumina, and microwave of 250 W was introduced into the plasma generation chamber through the waveguide 103 and the microwave introducing window 102 to thereby generate hydrogen gas plasma. The hydrogen gas plasma generated in the plasma generation chamber was drawn out through the plasma jet nozzle 104, to which are attached magnets 105 (200 G) arranged parallel to each other at a distance of 15 mm. Thus there was formed a sheet-like hydrogen gas plasma 121 of about 15 mm in thickness in the film-forming chamber 100.

Concurrently, $Si_2F_6$ gas was fed at a flow rate of 20 sccm through the gas feed pipe 118 into the precursor generation chamber 116 wherein Si particles were placed and they were maintained at a temperature of 1150° C. by an infrared heating means 117 to thereby generate precursors containing $SiF_2$ radicals. With a distance between the boundary A of the sheet-like plasma 121 and the surface of the substrate B being kept at 30 mm, the precursors were supplied through the gas liberation holes of the precursor supply ring 115 into the vicinity of the substrate 108. At this time, the inner pressure of the film-forming chamber 100 was kept at about 0.1 mTorr by a pressure controller (not shown). Deposition was carried out for 60 minutes after the introduction of the precursors.

The above procedures were repeated under varied conditions. That is, the inner pressure of the film-forming chamber was kept at 0.1 mTorr, 5 mTorr, and 50 mTorr, and the distance between the boundary of the sheet-like plasma A and the surface of the substrate B was kept at 3 mm, 5 mm, 10 mm, 20 mm, 30 mm, 40 mm, 50 mm, 60 mm, and 70 mm.

The deposition rate was calculated from the thickness of the deposited film. There were obtained the results as shown in FIG. 4.

FIG. 4 shows the relationship between the distance between the substrate surface and the boundary of the sheet-like plasma and the rate at which the deposited film is formed under different pressures in the film-forming chamber. Curves a, b, and c denote the pressures of 0.1, 5, and 50 mTorr, respectively, in the film-forming chamber.

As FIG. 4 illustrates, it is understood that curves a, b, and c are alike, that is, the deposition rate is almost constant in the cases where the distance is in the range of 5 mm to 50 mm, although it decreases when the distance is smaller than 5 mm or larger than 50 mm. This tendency prevailed so long as the gas liberation holes of the precursor supply ring were positioned in the range specified above.

EXPERIMENT 2

Film deposition was carried out under different conditions using the apparatus as shown in FIG. 1. In some runs, the raw material gas was discharged in the direction perpendicular to the sheet-like plasma and the substrate, with the distance between the boundary of the sheet-like plasma and the substrate being kept at 5 mm, 10 mm, 20 mm, 30 mm, 40 mm, 50 mm, and 60 mm. In other runs, the raw material gas was discharged in the direction parallel to the sheet-like plasma and the substrate, with the distance kept at 30 mm and the inner pressure of the film-forming chamber kept at 0.1 mTorr, 1 mTorr, 10 mTorr, 50 mTorr, and 100 mTorr.

The thickness of the deposited film was measured at several points and the thickness distribution was examined. There were obtained the results as shown in FIG. 5.

FIG. 5 shows the relationship between the pressure in the film-forming chamber and the distribution of the film thicknesses, with the parameters being the direction of gas discharge and the distance between the boundary of the sheet-like plasma and the substrate surface.

When the pressure in the film-forming chamber was lower than 0.1 mTorr, the sheet-like plasma was unstable for film forming. When the distance between the boundary of the sheet of the sheet like plasma and the substrate surface was 5 to 50 mm and the raw material gas was discharged in the direction perpendicular to the sheet-like plasma and the substrate, the distribution of the film thicknesses greatly varied depending upon the inner pressure of the film-forming chamber, as shown by the curve d. In other words, the thickness distribution was good when the inner pressure was in the range of 0.1 to 50 mTorr, whereas it was very poor when the pressure exceeded 50 mTorr. In the case where the raw material gas was discharged in the direction parallel to the sheet-like plasma and the substrate, the thickness distribution was apparently poorer than in the case where the raw material gas was discharged in the direction perpendicular to the sheet-like plasma and the substrate, as indicated by the curve e. In the case where the distance was 60 mm and the raw material gas was discharged in the perpendicular direction the thickness distribution was very poor as indicated by the curve f.

The film-forming experiments were also carried out at varied flow rates of $SiF_4$ gas and $H_2$ gas, and the deposition rate and the distribution of film thicknesses were examined. The results were similar to those shown in FIGS. 4 and 5.

The above results indicate that it is desirable that the distance between the boundary of the sheet-like hydrogen gas plasma and the substrate surface should be in the range of 5 mm to 50 mm, the inner pressure of the film-forming space should be in the range of 0.1 mTorr to 50 mTorr, and the raw material gas should be discharged in the direction perpendicular to the hydrogen gas plasma and the substrate.

According to the present invention, the precursor generated in the precursor generation space should have a life span of longer than 0.1 second, preferably longer than 1 second, and most desirably longer than 10 seconds. An adequate life span is selected according to the productivity and the easiness of handling.

As the raw material gas to be used for generating precursors in the present invention, there can be mentioned, for example, compounds containing silicon(Si) and halogen(X), compounds containing carbon(C) and halogen(X), or compounds containing germanium (Ge) and halogen (X). These compounds may be used alone or in combination with one another.

The compound containing Si and halogen(X) includes chain or cyclic silane compounds, with all or portion of hydrogen atoms substituted by halogen atoms(X). Example of such compounds include chain silicon halide represented by the formula $Si_uT_{2u+2}$ (where u is an integer of 1 or above, and Y is at least one element selected from F, Cl, Br, and I); cyclic silicon halide represented by the formula $Si_vY_{2v}$ (where v is an integer of 3 or above, and Y is defined as above); and chain or cyclic compounds represented by the formula $Si_uH_xY_y$ (where u and Y are defined as above, and $x+Y=2u$ or $2u+2$).

Specific examples of the usable silicon compounds are $SiF_4$, $(SiF_2)_5$, $(SiF_2)_6$, $(SiF_2)_4$, $Si_2F_6$, $Si_3F_8$, $SiHF_3$, $SiH_2F_2$, $Si_2H_2F_4$, $Si_2H_3F_3$, $SiCl_4$, $(SiCl_2)_5$, $SiBr_4$, $(SiBr_2)_5$, $Si_2Cl_6$, $Si_2Br_6$, $SiHCl_3$, $SiHBr_3$, $SiHI_3$, and $Si_2Cl_3F_3$. They are in the gaseous state or easily gasifiable. These silicon compounds may be used alone or in combination with one another.

The compound containing C and halogen (X) includes chain or cyclic hydrocarbon compounds, with all or portion of hydrogen atoms substituted by halogen atoms(X). Examples of such compounds include chain carbon halide represented by the formula $C_uY_{2u+2}$ (where u is an integer of 1 or above, and Y is at least one element selected from F, Cl, Br, and I); cyclic carbon halide represented by the formula $C_vY_{2v}$ (where v is an integer of 3 or above, and Y is defined as above); and chain or cyclic compounds represented by the formula $C_uH_xY_y$ (where u and Y are defined as above, and $x+y=2u$ or $2u+2$).

Specific examples of the usable carbon compounds are $CF_4$, $(CF_2)_5$, $(CF_2)_6$, $(CF_2)_4$, $C_2F_6$, $C_3F_8$, $CHF_3$, $CH_2F_2$, $CCl_4$, $(CCl_2)_5$, $CBr_4$, $(CBr_2)_5$, $C_2Cl_6$, $C_2Br_6$, $CHCl_3$, $CHI_3$, and $C_2Cl_3F_3$. They are in the gaseous state or easily gasifiable. These carbon compounds may be used alone or in combination with one another.

The compound containing Ge and halogen(X) includes chain or cyclic germanium halide compounds, with all or portion of hydrogen atoms substituted by halogen atoms(X). Examples of such compounds include chain germanium halide represented by the formula $Ge_uY_{2u+2}$ (where u is an integer of 1 or above, and Y is at least one element selected from F, Cl, Br, and I); cyclic germanium halide represented by the formula $Ge_vY_{2v}$ (where v is an integer of 3 or above, and Y is defined as above); and chain or cyclic compounds represented by the formula $Ge_uH_xY_y$ (where u and Y are defined as above, and $x+y=2u$ or $2u+2$).

Specific examples of the usable germanium compounds are $GeF_4$, $(GeF_2)_5$, $(GeF_2)_6$, $(GeF_2)_4$, $Ge_2F_6$, $Ge_3F_8$, $GeHF_3$, $GeH_2F_2$, $GeH_2F_4$, $Ge_2H_3F_3$, $GeCl_4$, $(GeCl_2)_5$, $GeBr_4$, $(GeBr_2)_5$, $Ge_2Cl_6$, $Ge_2Br_6$, $GeHCl_3$, $GeHBr_3$, $GeHI_3$, and $Ge_2Cl_3F_3$. They are in the gaseous state or easily gasifiable. These germanium compounds may be used alone or in combination with one another.

In the case where a plurality of raw material gases are used for film forming, they may be introduced into the activation space all together (as a mixture) or separately from individual supply sources.

The deposited film formed by the HR-CVD process of the present invention may be doped with an impurity element. The doping may be carried out during or after film-forming. An adequate element as p-type impurity includes B, Al, Ga, In, and Tl which belong to Group IIIA of the Periodic Table. An adequate element as n-type impurity includes P, As, Sb, and Bi which belong to Group VA of the Periodic Table. Most suitable among them are B, Ga, P, and Sb. The amount of doping impurities should be properly determined according to the electrical and optical properties required.

The substance containing the impurity element as a component (or the substance from which the impurity is imparted) should be selected from those compounds which are gaseous at normal temperature under normal pressure or at least under the film-forming conditions, or those compounds which are easily gasified by an adequate vaporizer. Examples of such compounds include $PH_3$, $P_2H_4$, $PF_3$, $PF_5$, $PCl_3$, $AsH_3$, $AsF_3$, $AsF_5$, $AsCl_3$, $SbH_3$, $SbF_5$, $BF_3$, $BCl_3$, $BBr_3$, $B_2H_6$, $B_4H_{10}$, $B_5H_9$, $B_5H_{11}$, $B_6H_{10}$, $B_6H_{12}$, and $AlCl_3$. They may be used alone or in combination with one another.

The compound containing the impurity element may be introduced into the film-forming space as such in the gaseous state, or may be introduced into the film-forming space after activation in the activation space as in the case of the raw material gas for film formation.

According to the HR-CVD process of the present invention, the precursor can be formed in the activation space by the use of electrical energy (e.g., microwave, RF, low frequency, and DC), thermal energy (e.g., heating by heater or infrared ray), or optical energy. If necessary, the activation energy may be used in combination with a catalyst. In the case where a plurality of raw material gases are used for film forming, they may be introduced into the activation space all together (as a mixture) or separately from individual supply sources.

DESCRIPTION OF THE PREFERRED EMBODIMENTS

The invention will be described in more detail with reference to the following examples, which are not intended to restrict the scope of the invention.

EXAMPLE 1

A silicon deposited film was formed in the following manner using the apparatus shown in FIG. 1.

First, a Corning No. 7059 glass substrate 108 of 50 mm in diameter was placed on the substrate holder 109 in the film-forming chamber 100. The film-forming chamber 100 was evacuated through the gas exhaust pipe 119 until the inner pressure became about $1 \times 10^{-6}$ Torr. Then the substrate 108 was heated by the heater 110 and the temperature of the substrate surface was maintained at 250° C. The temperature was controlled by the temperature controller 113.

When the temperature of the substrate surface became stable, hydrogen ($H_2$) was introduced at a flow rate of 50 sccm into the plasma generation chamber 101 through the gas supply pipe 107. Then, the inner pressure of the film-forming chamber 100 was kept at about 0.5 mTorr. The inner pressure was controlled by a pressure controller (not shown). An electric current was applied to the plasma transfer magnet 106 (which is an electromagnet) so that a magnetic force (875 G) was generated in the vicinity of the microwave introducing window 102 made of a high-purity alumina, and microwave of 300 W was introduced into the plasma generation chamber through the waveguide 103 and the microwave introducing window 102. The hydrogen gas plasma generated in the plasma generation chamber under the ECR conditions was drawn out through the plasma jet nozzle 104, to which are attached magnets 105 (200 G) arranged parallel to each other at a distance of 15 mm. Thus there was formed a sheet-like hydrogen gas plasma 121 of about 15 mm in thickness in the film-forming chamber 100.

Concurrently, $Si_2F_6$ gas was fed at a flow rate of 5 sccm through the gas feed pipe 118 into the precursor generation chamber 116 maintained at a temperature of 700° C. by an infrared heating means 117 to thereby generate precursors containing $SiF_2$ radicals. With a distance between the boundary A of the sheet-like plasma 121 and the surface of the substrate B being kept at 30 mm, the precursors were supplied through the gas liberation holes of the precursor supply ring 115 into the vicinity of the substrate 108. At this time, the inner pressure of the film forming chamber 100 was controlled to 0.5 mTorr by a pressure controller (not shown).

After 60 minutes of deposition since the introduction of the $Si_2F_6$ gas, there was obtained a 1.1 μm thick deposited silicon film. The thickness variation of the deposited film was within 5.5% throughout the entire area.

The resultant deposited film was examined for orientation by way of the electron diffraction (RHEED). It exhibited an intense spot-like orientation corresponding to the (110) orientation.

Figure 2:
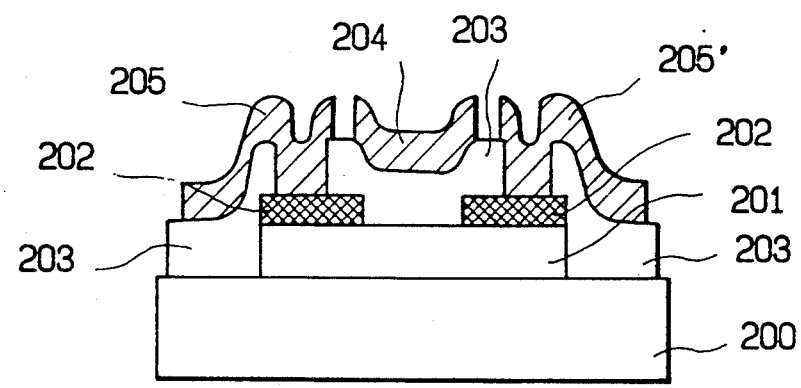
FIG. 2 is a schematic drawing of a TFT produced by the process of the present invention for the formation of a deposited film.

Separately, there was prepared a TFT (thin film transistor) having a semiconductor layer 201 comprising the above silicon film which has the configuration as shown in FIG. 2. Incidentally, the transistor has an n+ layer 202 and an insulating layer 203 respectively formed by a conventional RF plasma CVD method.

The TFT shown in FIG. 2 comprises a glass substrate 200, a semiconductor layer 201 (a first layer, 4500 Å thick), an n+ layer 202 highly doped with phosphorus (a second layer, 600 Å thick), an insulating layer 203 (a third layer, 2000 Å thick), an aluminum gate electrode 204, a source electrode 205, and a drain electrode 105'.

As a result of examining this TFT, it has been found that the TFT provides a favorable effective carrier mobility of higher than 15 cm$^2$/V.sec.

EXAMPLE 2

A deposited silicon film was formed using the apparatus shown in FIG. 1 in the same manner as in Example 1 except that the glass substrate of Corning #7059 was replaced by an Si wafer of 2 inches in diameter and with an orientation of (100), the temperature of the substrate surface was maintained at 300° C., the flow rate of $Si_2F_6$ was made to be 2.5 sccm, and the distance between (A) and (B) was made to be 20 mm.

After 60 minutes of deposition since the introduction of the $Si_2F_6$ gas, there was obtained a 0.8 μm thick deposited silicon film.

The deposited film was examined for its orientation by way of the electron diffraction pattern (RHEED). It exhibited the (100) orientation in a streak state. And it has been found that the resultant deposited film was an epitaxial Si film with good surface properties. The deposited film was also examined by SIMS for the depthwise profile of F in the vicinity of the interface. A slight increase of each element was found in the range of 200 Å; but it was found that a good interface was formed.

EXAMPLE 3

A silicon deposited film was formed using the apparatus shown in FIG. 1 in the same manner as in Example 2 except that the (100) Si wafer was replaced by a (110) Si wafer.

After 60 minutes of deposition since the introduction of the $Si_2F_6$ gas, there was obtained a 0.8 μm thick deposited silicon film.

The deposited film was examined by way of the electron diffraction (RHEED). As a result, it has been found that an epitaxial Si film was formed in almost the same satisfactory situation as in the case of Example 2.

EXAMPLE 4

A deposited silicon film was formed using the apparatus shown in FIG. 1 in the same manner as in Example 1, except that: in place of the sole use of $H_2$ gas at a 50 sccm, $H_2$ gas and Ar gas were introduced into the plasma generation chamber 101 through the gas supply pipe 107 at respective flow rates of 15 sccm and 30 sccm while maintaining the inner pressure at 20 mTorr to thereby form a sheet-like $H_2$/Ar gas plasma in the film forming chamber, and in place of the $Si_2F_6$ gas, $SiF_4$ gas was supplied at a flow rate of 30 sccm through the precursor generation chamber 116 comprising a quartz tube 116 containing Si particles heated at 1150° C. by the infrared heating means 117.

After 60 minutes of deposition since the introduction of the $SiF_4$ gas, there was obtained a 2.5 μm thick deposited silicon film. The thickness variation of the deposited film was within 6% throughout the entire area.

The silicon deposited film was examined by way of the electron diffraction (RHEED). It was found to be amorphous by the halo pattern.

Separately, there was prepared a TFT having a semiconductor layer 201 comprising the above silicon film which has the configuration as shown in FIG. 2. Incidentally, the transistor has an n+ layer 202 and an insulating layer 203 respectively formed by a conventional RF plasma CVD method.

The TFT was found to provide a favorable effective carrier mobility higher than 0.65 cm$^2$/V sec.

EXAMPLE 5

A silicon and germanium-containing deposited film was formed using the apparatus shown in FIG. 1 in the same manner as in Example 1 except that in addition to the $Si_2F_6$ gas, $GeF_4$ gas was introduced at a flow rate of 0.5 sccm through precursor generation chamber 116' comprising a quartz tube containing Ge particles heated by the infrared heating means 117'.

After 60 minutes of deposition since the introduction of the raw material gases, there was obtained a 2.8 μm thick silicon and germanium containing deposited film. The thickness variation of the deposited film was found to be within 6% throughout the entire area.

Figure 3:
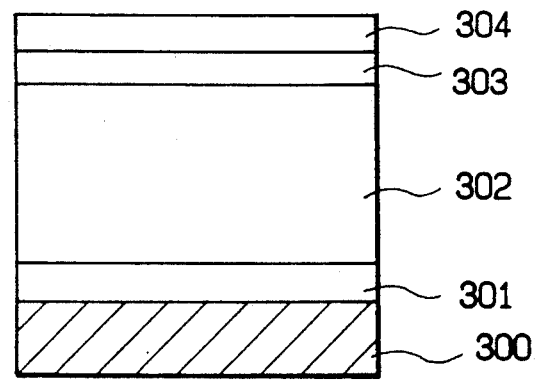
FIG. 3 is a schematic drawing of a solar cell produced by the process of the present invention for the formation of a deposited film.

Separately, there was prepared a solar cell having a semiconductor layer 302 comprising the above silicon and germanium-containing deposited film which has the configuration as shown in FIG. 3. The solar cell shown in FIG. 3 comprises a glass substrate 300 on which is deposited a transparent electrode, a first layer 301 (p-type amorphous silicon film, pb 400 Å thick), a second layer 302 (i-type amorphous silicon-germanium film, 0.6 μm thick), a third layer 303 (n type amorphous silicon film, 400 Å thick), and an aluminum electrode 304.

The first layer 301 was formed in the same manner as in Example 4 except that the $H_2$/Ar gas was mixed $BF_3$ gas (diluted to 1500 ppm with $H_2$ gas) at a flow rate of 7 sccm. The third layer was formed in the same manner as in Example 4 except that the $H_2$/Ar gas was mixed with $PH_3$ gas (diluted to 1000 ppm with $H_2$ gas) at a flow rate of 6 sccm.

The solar cell was found to have a photoelectric conversion efficiency of more than 9% when irradiated with light of AM-1 (100 mW/cm$^2$).

EXAMPLE 6

A silicon and carbon-containing deposited film was formed in the same manner as in Example 1 except that: the flow rate of $H_2$ gas was changed to 30 sccm; the inner pressure of the film-forming chamber was maintained at 2 mTorr; the flow rate of $Si_2F_6$ gas was changed to 15 sccm; and $CH_3F$ gas was introduced at a flow rate of 10 sccm through the gas supply pipe 118' and microwave power of 150 W was supplied to the precursor generation chamber 116' by the activation energy supply means 117' comprising microwave introducing means, whereby precursors comprising radicals of fluorinated carbon hydrides were formed and they were introduced into the film-forming chamber.

After 60 minutes of deposition since the introduction of the raw material gas, there was obtained a 0.7 μm thick silicon and carbon-containing deposited film. The thickness variation of the deposited film was within 5% throughout the entire area.

The deposited film was found to have an optical band gap of 2.1 eV. Separately, the deposited film was provided with an aluminum comb-shaped electrode (with a gap width of 250 μm) by way of a conventional vapor deposition method. As a result of examining the resultant, it has been found that the resultant exhibits a conductivity (op) of $2 \times 10^{-6}$ S.cm$^{-1}$ with irradiation of light of AM-1 (100 mW/cm$^2$).

EXAMPLE 7

A deposited carbon film was formed using the apparatus shown in FIG. 1 in the same manner as in Example 6 except that the $Si_2F_6$ gas was not used, the flow rate of $H_2$ gas was changed to 100 sccm, the inner pressure of the film-forming chamber was changed to 1 mTorr, and the flow rate of $CH_3F$ gas was changed to 5 sccm.

After 60 minutes of deposition since the introduction of the $CH_3F$ gas, there was obtained a 0.5 μm thick deposited carbon film. The thickness variation of the deposited film was found to be within 5% throughout the entire area.

As a result of examining the deposited carbon film, it has been found that it has a Mohs hardness of higher than 9. The deposited carbon film was also examined for structure by way of Raman scattering spectrum. As a result, it has been found that intense peaks appear in the vicinity of 1340 cm$^{-1}$ and 1590 cm$^{-1}$, which suggests a diamond or graphite structure, as compared with the peak in the vicinity of 1530 cm$^{-1}$ suggesting the amorphous structure.

As mentioned above, the HR-CVD process of the present invention provides various advantages. That is, the surface of the substrate surface is not exposed directly to plasma upon forming a deposited film; this prevents the deposited film from being damaged with plasma and thus, the resulting deposited film becomes to be of a good quality; it is possible to form an amorphous or crystalline film or an epitaxial film having desired characteristic properties; in the production of a device of laminate type, the interface can be formed without plasma damage, and this leads to improve the interface characteristics.

Further, according to the HR-CVD process of the present invention, the hydrogen gas plasma is confined in the vicinity of the substrate. This permits hydrogen radicals in high concentrations to be supplied uniformly over a large area. In addition, the HR-CVD process of the present invention makes it possible to control the film quality uniformly and consistently by adequately selecting the distance between the sheet-like plasma and the substrate, the position for the introduction of the precursor, and the inner pressure of the film-forming chamber. Moreover, the HR-CVD process of the present invention enables one to form a desirable deposited film only in the vicinity where the precursor (as the raw material for the formation of the deposited film) is introduced. This allows the raw material gas to be used efficiently and to be deposited selectively in any place on the substrate. The HR-CVD process of the present invention does not cause deposition of films on the microwave introducing window through which microwave is introduced for the generation of sheet-like plasma This permits the sheet-like plasma to be maintained stably. The HR-CVD process of the present invention enables one to form high quality deposited films of varied compositions effectively and consistently by selectively using the kind of precursors capable of contributing to the formation of a deposited film.

What we claim is:

1. A process for forming a deposited film on a substrate employing a film-forming space (A) having a holder for holding said substrate therein, a precursor-generating space (B) isolated from the film-forming space (A), means for generating a gaseous precursor in said precursor-generating space (B), gas supply means for supplying said gaseous precursor generated in said precursor-generating space (B) into said film-forming space (A), exhaust means for exhausting said film-forming space (A) and a hydrogen plasma-generating space (C) isolated from any of said film-forming space (A) and said precursor-generating space (B), said process comprising:

(a) generating said gaseous precursor consisting essentially of Group IV elements in said precursor generating space (B);
(b) drawing a sheet-like hydrogen gas plasma generated in said hydrogen plasma-generating space (C) into said film-forming space (A) substantially parallel to the surface of said substrate such that a space (L) of 5 to 50 mm is maintained between a boundary of said hydrogen gas plasma sheet and said substrate surface in order to preclude direct exposure of said substrate surface to said hydrogen gas plasma;
(c) maintaining an outlet of said gas supply means within said space (L) and supplying said gaseous precursor through said gas supply means into said space (L) to react with hydrogen radicals from said hydrogen gas plasma, which radicals diffuse toward said substrate surface from said hydrogen gas plasma;
(d) maintaining said film-forming space (A) at a vacuum of 0.1 to 50 mTorr during formation of said deposited film; and
(e) exhausting reaction gases in said film-forming space (A) employing said exhaust means in a direction perpendicular to and downstream from said sheet-like hydrogen gas plasma and said substrate surface.

2. A process according to claim 1, wherein said hydrogen gas plasma is formed from hydrogen gas.

3. A process according to claim 1, wherein said gaseous precursor is formed from one or more members selected from the group consisting of halides containing at least one kind of element selected from the group consisting of Si, Ge and C.

4. A process according to claim 1, wherein said hydrogen gas plasma contains plasma of a member selected from the group consisting of helium, argon, neon and xenon and said plasma is formed by using hydrogen gas and a gas selected from the group consisting of helium gas, argon gas, neon gas and xenon gas in combination.

5. A process according to claim 4, wherein said gaseous precursor is formed from one or more members selected from the group consisting of halides containing at least one kind of element selected from the group consisting of Si, Ge and C.

6. A process according to claim 1 including conducting the step of exhausting the reaction gases in the film-forming space through a plurality of exhaust pipes being situated (i) in parallel with the axis of a substrate holder for supporting the substrate thereon and (ii) beneath the substrate.

* * * * *